(12) United States Patent
Johannsen et al.

(10) Patent No.: US 10,873,519 B2
(45) Date of Patent: Dec. 22, 2020

(54) SYSTEM AND METHOD FOR TRANSMITTING TIME-SYNCHRONIZED DATA FROM A CONTROLLER OF AN AUTOMATION SYSTEM COMPRISING A LOCAL TIME TO AT LEAST ONE SUBSCRIBER OF THE AUTOMATION SYSTEM

(71) Applicant: BECKHOFF AUTOMATION GMBH, Verl (DE)

(72) Inventors: Nils Johannsen, Lübeck (DE); Birger Evenburg, Lübeck (DE); Henning Mersch, Verl (DE)

(73) Assignee: Beckhoff Automation GmbH, Verl (DE)

( * ) Notice: Subject to any disclaimer, the term of this patent is extended or adjusted under 35 U.S.C. 154(b) by 357 days.

(21) Appl. No.: 15/958,740

(22) Filed: Apr. 20, 2018

(65) Prior Publication Data

US 2018/0309653 A1 Oct. 25, 2018

(30) Foreign Application Priority Data

Apr. 21, 2017 (DE) .......................... 10 2017 108 571

(51) Int. Cl.
| | |
|---|---|
| *H04L 12/26* | (2006.01) |
| *G05B 19/042* | (2006.01) |
| *G01R 19/25* | (2006.01) |
| *G05B 15/02* | (2006.01) |
| *G06Q 50/06* | (2012.01) |

(52) U.S. Cl.
CPC ............ *H04L 43/106* (2013.01); *G01R 19/25* (2013.01); *G05B 15/02* (2013.01); *G05B 19/0423* (2013.01); *G05B 2219/25472* (2013.01); *G05B 2219/25483* (2013.01); *G06Q 50/06* (2013.01)

(58) Field of Classification Search
CPC ...................................................... H04L 43/106
USPC .......................................................... 702/57
See application file for complete search history.

(56) References Cited

U.S. PATENT DOCUMENTS

| | | | |
|---|---|---|---|
| 7,924,888 B2 | 4/2011 | Schultze et al. | |
| 8,938,636 B1* | 1/2015 | Hochschild | H04J 3/0661 |
| | | | 713/401 |
| 9,673,970 B1* | 6/2017 | Aweya | H04W 36/30 |
| 2007/0198706 A1* | 8/2007 | Mechelli | H04L 69/28 |
| | | | 709/224 |
| 2008/0027961 A1* | 1/2008 | Arlitt | H04L 43/08 |
| 2011/0022708 A1* | 1/2011 | Candia | H04L 43/12 |
| | | | 709/224 |
| 2013/0326088 A1* | 12/2013 | Uchida | H04L 41/50 |
| | | | 709/248 |

(Continued)

FOREIGN PATENT DOCUMENTS

| | | |
|---|---|---|
| DE | 60127454 T2 | 12/2007 |
| EP | 1810096 B1 | 6/2011 |

OTHER PUBLICATIONS

Mills, "Simple Network Time Protocol (SNTP) Version 4 for IPv4, IPv6 and OSI," Network Working Group, Jan. 2006 (27 pages).

*Primary Examiner* — Ricky Ngon
(74) *Attorney, Agent, or Firm* — Dorsey & Whitney LLP

(57) ABSTRACT

A method for transmitting time-synchronized data from a controller of an automation system comprising a local time to at least one subscriber of the automation system, wherein the automation system comprises a server having a reference time.

20 Claims, 4 Drawing Sheets

(56) References Cited

U.S. PATENT DOCUMENTS

2015/0207877 A1* 7/2015 Ito ...................... H04L 67/1095
709/248
2016/0359609 A1* 12/2016 Ito ...................... H04L 43/0852

* cited by examiner

SYSTEM AND METHOD FOR TRANSMITTING TIME-SYNCHRONIZED DATA FROM A CONTROLLER OF AN AUTOMATION SYSTEM COMPRISING A LOCAL TIME TO AT LEAST ONE SUBSCRIBER OF THE AUTOMATION SYSTEM

CROSS-REFERENCE TO RELATED APPLICATION

This application claims the priority of German patent application DE 10 2017 108 571.8, filed Apr. 21, 2017, entitled KONZEPT ZUM ÜBERMITTELN VON ZEIT-SYNCHRONISIERTEN DATEN VON EINER EINE LOKALE ZEIT AUFWEISENDEN STEUERUNG EINES AUTOMATISIERUNGSSYSTEMS AN ZUMINDEST EINEN TEILNEHMER DES AUTOMATISIERUNGS-SYSTEMS, the disclosure of which is hereby incorporated by reference in its entirety and for all purposes.

FIELD

The present invention relates to a method for transmitting time-synchronized data from a controller of an automation system comprising a local time to at least one subscriber of the automation system. The present invention further relates to a controller for an automation system. Moreover, the present invention relates to an automation system. The present invention further relates to a computer program.

BACKGROUND

For an automation system comprising a controller and a server it is usually important that e.g. measurement data are sent from the controller to the server with a precisely time-synchronized time information. This is e.g. important for different application cases, two of which are exemplarily described in the following:

The server allows for carrying out functionalities which require measurement data having a predetermined time interval in order to carry out calculations. In this context, it is advantageous if the number of measurement data within a predetermined time interval remains constant. Due to a time difference between the local time of the control and the server time, the number of measurement data within a predetermined time interval may, however, vary.

In order to compare different systems, it is advantageous, depending on the application, to process measurement data pertaining to the same points in time.

European patent EP 1 810 096 B1 teaches a method for exchanging data between subscribers from various networks.

SUMMARY

The present invention provides a concept for efficiently transmitting time-synchronized data from a controller of an automation system comprising a local time to at least one subscriber of the automation system.

EXAMPLES

According to an aspect, a method for transmitting time-synchronized data from a controller of an automation system having a local time to at least one subscriber of the automation system is provided wherein the automation system comprises a server having a reference time, the method comprising the following steps:

sending a reference time request to the server by means of the controller, receiving a response from the server by means of the controller, wherein the response comprises a first receiving time of the request which indicates when the request was received by means of the server according to the reference time, determining, by means of the controller, a time difference between the reference time of the server and the local time of the controller based on a sending time that indicates when the request according to the local time was sent by means of the controller based on the first receiving time and based on a second receiving time which indicates when the response according to the local time was received by means of the controller, adding a time stamp to data by means of the controller wherein the time stamp is determined based on the local time and the time difference in order to receive time-synchronized data, wherein the data comprise measurement data and/or are based on measurement data, transmitting the time-synchronized data by means of the controller to the at least one subscriber of the automation system.

According to a further aspect, an automation system comprises a controller, wherein time-synchronized data from the controller of the automation system having a local time are transmitted to at least one subscriber of the automation system. The automation system further comprises a server having a reference time. The controller sends a reference time request to the server. The controller receives a response from the server, wherein the response comprises a first receiving time of the request which indicates when the request was received by means of the server according to the reference time. The controller determines a time difference between the reference time of the server and the local time of the controller based on a sending time that indicates when the request according to the local time was sent by means of the controller based on the first receiving time and based on a second receiving time which indicates when the response according to the local time was received by means of the controller. The controller adds a time stamp to the data, wherein the time stamp is determined based on the local time and the time difference in order to receive time-synchronized data, wherein the data comprise measurement data and/or are based on measurement data. The controller transmits the time-synchronized data to the at least one subscriber of the automation system.

According to a further aspect, an automation system comprises one or a plurality of spatially distributed facilities for generating regenerative energy that are each controlled by an associated controller, wherein each of the facilities comprises one or a plurality of sensors, respectively, wherein a time stamp is each added to the respective measurement data or, respectively, to the respective processed measurement data of these sensors of the individual facilities in order to obtain time-synchronized data wherein the time-synchronized data are provided from a controllers of one of the facilities to the other controller of the other facilities so that the other controllers control their associated facility based on the time-synchronized data.

The time of the controller, i.e. the local time of the controller, is synchronized with the time of the server, i.e. the reference time of the server. This e.g. has the technical advantage that a time stamp may be added to data, e.g.

measurement data, e.g. processed measurement data, e.g. a result of a processing of measurement data, whereby said time stamp may efficiently be compared to time stamps of corresponding data of other controller that have synchronized their local time in analogy to the reference time of the server.

This advantageously e.g. allows to compare data of different controllers at the same points in time and to subsequently process them.

This particularly provides the technical advantage that functionalities may efficiently be carried out on at least one subscriber of the automation system, said functionalities requiring data for calculations in a predetermined time interval.

This particularly provides the technical advantage that a concept for efficiently transmitting time-synchronized measurement data from a controller of an automation system comprising a local time may be provided to at least one subscriber of the automation system.

Data in terms of the description comprise or, respectively, are e.g. measurement data. Measurement data are or, respectively, comprise e.g. raw measurement data (which may also referred to as direct measurement data), i.e. unprocessed measurement data.

Measurement data in terms of the description are e.g. processed measurement data (which may also be referred to as indirect measurement data), i.e. measurement data that have e.g. been prepared.

Data in terms of the description comprise or, respectively, are e.g. processed measurement data.

Data in terms of the description are e.g. based on measurement data. This means that such data have been determined on the basis of measurement data. Specifically, data comprise or, respectively, are a result evaluating measurement data.

According to an embodiment, it is provided that the transmission time is sent to the server together with the request by means of the controller.

This e.g. has the technical advantage that the server is enabled to send the transmission time to the controller with its response.

In another embodiment, it is provided that the response comprises the transmission time.

This e.g. has the technical advantage that the controller may determine the time difference directly from the response without having to read out the transmission time from an internal memory prior to that. Furthermore, it is no longer required that the controller store the transmission time itself for determining the time difference as the transmission time is in this embodiment again provided by the server together with the response. As a result, extensive memory processes for the controller may effectively be reduced. As a result, the memory required for the controller may furthermore be reduced.

In a further embodiment, it is provided that the steps a), b) and c) are repeated in a cyclic manner by means of the controller in order to determine a plurality of time differences wherein a mean value of the plurality of time differences is determined which is used for determining the time stamp by means of the controller.

This particularly provides the technical advantage that e.g. an initial transient response may effectively be taken into account. This particularly provides the technical advantage that skips after a transient response of the time may efficiently be avoided. In particular, the technical advantage is provided that possible skips in the time differences may efficiently be averaged out over time.

This embodiment hence provides that the mean value of the several time differences is used as a time difference for determining the time stamp by means of the controller. This particularly means that the time stamp is determined based on the local time and the mean value of the plurality of time differences in order to obtain time-synchronized measurement data.

According to a further embodiment, it is provided that the steps a), b) and c) are repeated several (or more than two) times in a cyclic manner by means of the controller in order to determine a plurality of time differences, wherein a filtering function is applied to the plurality of time differences by means of the controller in order to obtain a filtered time difference which is used as a time difference for determining the time stamp by means of the controller.

The filtering function e.g. comprises calculating a mean value, e.g. a median, e.g. an arithmetic mean value.

The filtering function e.g. comprises a transmitting function, e.g. a PT1 link. PT1 links are e.g. common in automatic control engineering.

A PT1 link is e.g. a low-pass filter of the first order. Low-pass filters have a similar effect as averaging insofar as high-frequency fractions of an input signal may effectively be reduced. Thus, a fluctuation of the values of an output signal may efficiently be reduced.

This particularly allows for the technical advantage that e.g. an initial transient response may efficiently be considered. In particular, this has the technical advantage that skips after a transient response may efficiently be prevented. In particular, this has the technical advantage that possible time-difference skips may efficiently be filtered out over time.

This embodiment thus provides that the time stamp is determined based on the local time and the filtered time difference in order to obtain time-synchronized measurement data.

In another embodiment it is provided that the time stamp is determined by means of the following equation:

$$t_{measurement\ data} = t_{local} + \Delta t_{server},$$

wherein $t_{measurement\ data}$ refers to the time stamp, $t_{local}$ refers to the local time of a controller and $\Delta t_{server}$ indicates the time difference.

This particularly has the technical advantage that the time stamp may efficiently be determined.

According to a further embodiment, it is provided that $\Delta t_{server} = t_U - t_1$, wherein $t_U$ is a corrected reference time, $t_1$ being the second receiving time, wherein $$t_U = t_R + \frac{(t_1 - t_0)}{2},$$

wherein $t_R$ indicates the first receiving time and $t_0$ the transmission time.

This e.g. has the technical advantage that the time difference may efficiently be transmitted.

According to a further embodiment, it is provided that the steps a), b) and c) are repeated several times in a cyclic manner by means of the controller in order to first detect a first corrected reference time $t_{U0}$ and subsequently, in a later second cycle, a second corrected reference time $t_{U1}$, wherein a correction value $\Delta_A$ is determined by means of the controller, wherein $$\Delta_A = \frac{(t_{U1} - t_{U0})}{(t_{L1} - t_{L0})} \times T_C,$$

$t_{L0}$ indicating the second receiving time corresponding to the first cycle, $t_{L1}$ indicating the second receiving time corresponding to the second cycle, $T_C$ referring to the cycle time, wherein the time difference $\Delta t1_{server}$ corresponding to the second cycle is corrected by means of the correction value $\Delta_A$ according to the following equation:

$$\Delta t1_{server} = \Delta t0_{server} + \Delta_A,$$

wherein $\Delta t0_{server}$ refers to the time difference corresponding to the first cycle.

This e.g. has the technical advantage that a potential drift of the local time may efficiently be adjusted.

Hence, in this context $T_C$ refers to the cycle time which indicates how often or, respectively, when the time stamp is re-calculated, i.e. updated. The internal time step of the controller is thus particularly adjusted by a corrective factor of the time steps on the server (drift between the server and the controller). $T_C$ thus does not refer to the real-time clock of the controller, but to a cycle for the update frequency of the time adjustment described herein (i.e. determining of the time difference). Hence, $T_C$ indicates how often or, respectively, when a new time difference is determined, including a subsequent adjustment of local time and reference time.

According to a further embodiment, it is provided that for each of a plurality of cycles a corrective value is determined, wherein a mean value of the respective corrective values is determined by means of the controller which is used as a corrective value for correcting, by means of the controller, a time difference corresponding to a cycle following one of the plurality of cycles.

This e.g. has the technical advantage that the corrective value may efficiently be determined.

According to a further embodiment, it is provided that a corrective value is determined for each of a plurality of cycles wherein a filtering function is applied to the plurality of corrective values by means of the controller in order to obtain a filtered corrective value which is used as a corrective value for correcting the time difference by means of the controller.

This e.g. has the technical advantage that the corrective value may efficiently be determined.

According to an embodiment, it is provided that the automation system is designed or configured to carry out the inventive method.

According to an embodiment, the controller comprises a communications interface that is configured to send the request via a communications network. The communications network of the controller is e.g. configured to receive the response from the server via the communications network. The communications interface of the controller is e.g. configured to transmit the time-synchronized measurement data to the server via the communications network.

According to an embodiment, the server comprises a communications interface that is configured to receive the request from the controller via the communications network. The communications interface of the server is e.g. configured to send the response to the controller via the communications network. The communications interface of the server is e.g. configured to receive the time-synchronized measurement data from the controller via the communications network.

According to an embodiment, the controller comprises a processor that is configured to determine the time difference between the server reference time and the local time of the controller based on the sending time, the first receiving time and the second receiving time. The processor of the controller is e.g. configured to determine the time stamp based on the local time and the time difference. The processor of the controller is e.g. configured to add the time stamp to the measurement data.

According to an embodiment, the server comprises a processor configured to determine the response.

The technical functionalities of the inventive method analogously result from the corresponding technical functionalities of the controller or, respectively, the automation system, and vice versa.

This particularly means that the method features result from the corresponding features referring to the controller or, respectively, to the automation system, and vice versa.

A communications network in terms of the description is e.g. a real-time-capable communications network, in particular an EtherCAT communications network.

According to an embodiment, the request for the reference time may be a request according to the Network Time Protocol.

According to an embodiment, the server response may be a response according to the Network Time Protocol.

According to an embodiment, the local time of the controller is a Distributed Clock Time. The Distributed Clock Time is a time base which is e.g. provided for a controller in an EtherCAT communications network. In an embodiment, the local time is e.g. based on a time base of a real-time-capable communications network, in particular a real-time-capable field-bus network.

According to an embodiment, the reference time of the server is Universal Time.

According to an embodiment, the server may draw its reference time from a different system.

According to an embodiment, the server may draw the reference time via GPS (Global Positioning System) and/or according to PTP (Precision Time Protocol).

According to an embodiment, the automation system may at least comprise one further controller.

The further controller e.g. synchronizes its local time with the local time of the controller in analogy to the synchronization of the local time of the controller with the server reference time. This particularly means that according to this embodiment the controller serves as a server for the further controller for the purpose of synchronization.

The technical functionalities of the further controller analogously result from the corresponding technical functionalities of the controller.

In an embodiment, the further controller may, analogously to the controller, directly adjust its local time analogously to the server.

The measurement data are e.g. sensor data, the sensor being e.g. connected to the controller or, respectively, connected to the latter via a communications connection. In a further embodiment, the measurement data may have been processed. Such a processed form may e.g. consist in determining a mean value of several measurement data. Such a processed form may e.g. consist in source-encoded measurement data, thus efficiently reducing the amount of measurement data. A processed for may e.g. comprise a method for reducing signal noise of the measurement data. In a further embodiment, the measurement data may e.g.

comprise various states of an automation system which will in the following be explained in more detail with reference to two examples:

Example 1

An engine speed of an electrical machine of the automation system is monitored. In 99.99% of its service time, the electrical machine is in an operational range in which it moves at 1000 revolutions per minute. This means that an engine speed of 1000 rpm corresponds to the engine speed of the operating point of the electrical machine. A speed sensor transmits the actually measured engine speed to a controller.

A controller processes the measured engine speed in such a way that the expected engine speed of the electrical machine (1000 rpm) may be subtracted from the actually measured engine speed. The result of this processing thus corresponds to a deviation from the operating point of the electrical machine. Said result is comprised by the data in terms of the present description.

Example 2

A temperature of a mechanical component of the automation system such as a transmission system is monitored. The mechanical component is manufactured from a material which, starting from a certain temperature Tx, is in an operational range in which the functionality of the mechanical component can no longer be guaranteed. A temperature sensor measures the temperature of the mechanical component on a regular basis.

A controller receives the measured temperature value of the temperature sensor. In this context, the precise temperature is at first not essential. Rather, the focus is on detecting in a timely manner whether the system has reached the temperature Tx. For this reason, the measured temperature is examined with regard to its value. In a simple functionality, it is examined whether the temperature value exceeds the value (Tx−200° C.). The result of this functionality is transmitted to a server. This result is comprised by the data in terms of the present description.

As a result, data in terms of the description e.g. comprise direct and/or indirect measurement data. In case of direct measurement data, these may e.g. be measurement data transmitted by a sensor. In the case of indirect measurement data, these may e.g. be measurement data that were pre-processed in a controller or a further controlling unit.

According to an embodiment, the automation system may comprise a sensor providing its measurement data to the controller.

In an embodiment, a plurality of sensors is provided.

A sensor may e.g. be one of the following sensors: a pressure sensor, a temperature sensor, a gas sensor, a video sensor, a magnetic sensor, a radar sensor, an ultrasound sensor, a current sensor, a voltage sensor, a light sensor, an engine speed sensor of an electrical machine, a position sensor for determining a position of a slide of a linear drive system, a meteorological sensor.

In an embodiment, the automation system comprises a linear drive system. The linear drive system is e.g. designed to drive one or a plurality of slides. The linear drive system e.g. comprises a position sensor for determining a position of a slide of the linear drive system. In a further embodiment, the automation system comprises one or several of the following elements: a machine tool, a forging press, an injection-molding machine, a filling machine or an industrial robot. In a further embodiment, the automation system comprises a wind-energy plant and/or a photovoltaic system.

In a further embodiment, the method further comprises receiving a command sent from the server by means of a controller, wherein the command stipulates that the controller is to send a request for the reference time to the server so that the request for the reference time is only sent to the server upon receiving the command by means of the controller.

According to this embodiment, it is thus provided that the controller does not by itself actively send the request for the reference time. Rather, the controller passively waits for receipt of the corresponding command before sending the request for the reference time.

In an alternative embodiment, it is provided that the controller outputs the request for the reference time independently from receiving a command sent from the server in which the command stipulates that the controller send a request for the reference time to the server.

According to this alternative embodiment, it is thus provided that the controller actively outputs the request for the reference time and does not wait for a corresponding server command. I.e. the server does not have to stipulate that the controller carry out an adjustment of the local time to the reference time. In particular, if a multitude of controllers is involved, the organizational workload for the server may thus efficiently be reduced.

In an embodiment, the at least one subscriber may comprise the server and/or a data-memory server for storing the time-synchronized data.

This e.g. means that the time-synchronized data are sent to the server and/or to the data-memory server and/or to a further subscriber of the automation system, e.g. to the further controller or e.g. to the further controllers.

Hence, the data-memory server is e.g. different from the server comprising a reference time.

The time-synchronized data are thus e.g. sent to one or a plurality of subscribers of the automation system.

The automation system particularly comprises the controller and the server comprising a reference time.

The automation system particularly comprises one or a plurality of subscribers.

A subscriber of the automation system is in particular an element selected from the following group of subscribers: a server comprising a reference time, a data-memory server, a controller.

The server comprising a reference time may also be referred to as a time server.

In an embodiment, the automation system comprises a plurality of spatially distributed wind-energy plants that are each controlled by an associated controller. The spatial distribution of the individual wind-energy plants is known to the server and/or to the controllers of the wind-energy plants.

Each of the wind-energy plants comprises one or a plurality of sensors. Such sensors e.g. comprise: wind sensors for measuring wind intensity, vibration sensors for measuring a vibration of components of the wind-energy plant, e.g. at a rotor blade.

According to the concept described herein, a time stamp is respectively added to each measurement data or, respectively, to the processed measurement data of these sensors of the individual wind-energy plants in order to obtain time-synchronized data. The time-synchronized data from a controller of one of the wind-energy plants are then e.g. provided to the other controllers of the other wind-energy plants. On the basis of the time-synchronized data, these can control their respective wind-energy plants.

If e.g. a change in wind intensity is measured in one of a plurality of wind-energy plants, a time stamp is added to the measured wind-intensity change in order to obtain a time-synchronized change of the wind intensity which is then sent to the other wind-energy plants. By using the time stamp and the measured wind intensity it is possible and intended to calculate at which points in time the changed wind intensity is to be expected in the other wind-energy plants.

Calculation of the points in time when the measured change of wind intensity is to be expected in the other wind-energy plants may take place e.g. locally in a server and/or peripherally in the controllers. An adjustment of the other wind-energy plants with regard to the change in wind energy may be carried out so that the behavior of the other wind-energy plants is optimized with regard to this meteorological condition. For instance, the position of the rotor blades of a wind-energy plant may be adjusted.

In a further embodiment, the automation system comprises several spatially distributed photovoltaic systems, each controlled by an associated controller. The spatial distribution of the individual photovoltaic systems is known to the server and/or the controllers of the photovoltaic systems.

Each of the photovoltaic systems comprises one or a plurality of sensors. Such sensors e.g. comprise: light sensors for measuring the irradiation intensity.

According to the concept described herein, a time stamp is added to each of the measurement data or, respectively, the processed measurement data of these sensors of the individual photovoltaic systems in order to obtain time-synchronized data. The time-synchronized data from a controller of one of the photovoltaic systems are then e.g. provided to the other controllers of the other photovoltaic systems which are then able to control the photovoltaic system on the basis of the time-synchronized data.

If e.g. in one of a plurality of photovoltaic systems a change of the irradiation intensity is measured, a time stamp is added to said change in irradiation intensity in order to obtain a time-synchronized change of irradiation intensity which is then sent to the other photovoltaic systems. It is possible by using the time stamp and the measured irradiation intensity to calculate at which points in time the changed irradiation intensity of the further photovoltaic systems is to be expected.

A change of the irradiation intensity may e.g. be caused by clouding. By using the time stamp and the measured irradiation intensity, it is possible and intended to calculate at which points in time the changed irradiation intensity is to be expected for the other photovoltaic systems.

The calculation of the points in time may be carried out locally in the server and/or peripherally in the controllers. An adjustment of the other photovoltaic systems with regard to the change in irradiation intensity is e.g. carried out. Such an adjustment e.g. comprises a change of parameters of the technical components of the photovoltaic systems. The inventive method results in an optimized behavior of the other photovoltaic systems.

Voltage and current of a photovoltaic cell of a photovoltaic system particularly depend on the irradiation intensity and/or particularly on the cell temperature. Thus, the operating point of a photovoltaic cell usually changes when the irradiation intensity changes.

The technical components of a photovoltaic system are e.g. elements selected from the following group of technical components: a.c. converters, energy storages.

An a.c. converter converts the direct voltage of a photovoltaic cell into an alternating voltage so that power can be fed into an a.c. network.

Specifically in photovoltaic systems on residential buildings, energy memories are frequently used. Thereby, part of the generated energy may be buffered and be taken from the energy storage, if required. For example, a reduced irradiation intensity would result in that sufficient energy would no longer be produced in order to cover the energy required by a residential building. In this case, energy would have to be taken from the energy storage.

Thus, it is e.g. provided that in case of a measured reduction in irradiation intensity energy is taken from an energy storage of one of the other photovoltaic systems as a precautionary means in order to cover a predetermined energy demand, e.g. of a residential or office building, or a building in general.

In an embodiment, it is provided that the automation system comprises several spatially distributed wind-energy plants that are each controlled by an associated controller, wherein each of the wind-energy plants comprises one or several sensors wherein a time stamp is respectively added to respective measurement data or processed measurement data of these sensors of the individual wind-energy plants in order to obtain time-synchronized data, the time-synchronized data being provided by a controller of one of the wind-energy plants to the other controllers of the other wind-energy plants so that the other controllers control their respective wind-energy plant on the basis of the time-synchronized data.

In an embodiment, it is provided that the automation system comprises several spatially distributed photovoltaic systems which are each controlled by an associated controller, wherein each of the photovoltaic systems respectively comprises one or several sensors, wherein a time stamp is added to the respective measurement data or to the respective processed measurement data of said sensor of the individual photovoltaic systems in order to obtain time-synchronized data, wherein the time-synchronized data are provided by a controller of one of the photovoltaic plants to the other controllers of the other photovoltaic plants so that the other controllers control their respective photovoltaic plants on the basis of the time-synchronized data.

In an embodiment, it is provided that the automation system comprises one or several spatially distributed plants for generating regenerative energy that are each controlled by an associated controller wherein each of the plants each comprises one or several sensors wherein a time stamp is added to each of the respective measurement data or to each of the respective processed measurement data of said sensors in order to obtain time-synchronized data wherein the time-synchronized data are provided by a controller of one of the plants to the other controllers of the other plants so that the other controllers control their respective plant on the basis of the time-synchronized data.

In this context, "regenerative" particularly may mean "renewable".

A plant for generating regenerative energy may be e.g. a photovoltaic system.

A plant for generating regenerative energy may be e.g. a wind-energy plant.

A plant for generating regenerative energy may also be referred to as an energy-generating plant for regenerative energy.

The wording "respective" particularly comprises the wording "and/or".

BRIEF DESCRIPTION OF THE DRAWINGS

The present invention is in the following explained in more detail in conjunction with preferred embodiments in which.

The same reference symbols can be used for the same features below. Furthermore, for the sake of clarity, provision is made for not all features to always be depicted in all drawings. A placeholder in the form of a geometric object is sometimes used for a group of features, for example.

DETAILED DESCRIPTION

Figure 1:
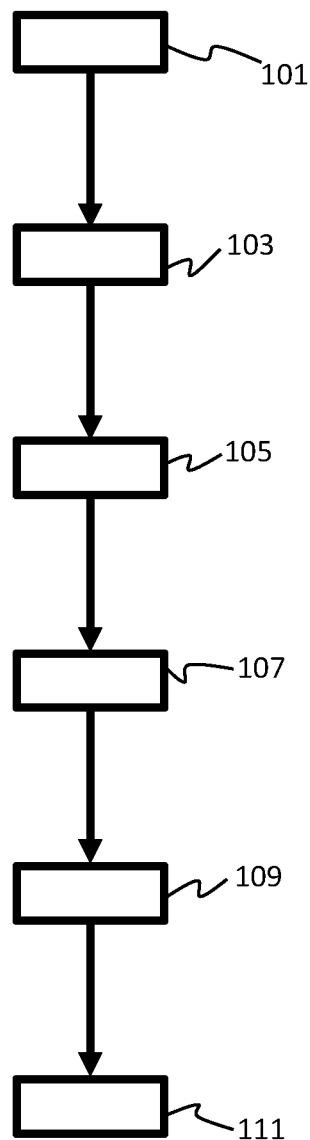
FIG. 1 shows a flow chart of a method for transmitting time-synchronized data.

FIG. 1 shows a flow chart of a method for transmitting time-synchronized data according to an embodiment.

The method comprises sending 101 of a request for the reference time to the server by means of the controller.

In response to the receipt of said request by means of the server, said server will determine a response comprising a first receiving time that indicates when the request according to the reference time was received by the server.

The server will then send its response to the controller. The server e.g. additionally transmits its processing time which indicates how much time the server has needed for determining the response.

Insofar, the method comprises a receipt 103 of a response from the server by means of the controller, wherein the response comprises the first receiving time of the response that indicates when the request according to the reference time was received by means of the server.

The method comprises determining 105 a time difference between the reference time of the server and the local time of the controller by means of the controller based on the transmission time that indicates when the request according to the local time was sent by means of the controller, based on the first and on the second receiving time that indicate when the response according to the local time was received by means of the controller.

The method comprises determining 107 of a time stamp based on the local time and the time difference.

The method comprises adding 109 the time stamp to the data by means of the controller in order to obtain time-synchronized data.

The method comprises transmitting 111 the time-synchronized data to the server by means of the controller and/or to a further subscriber of the automation system.

Figure 2:
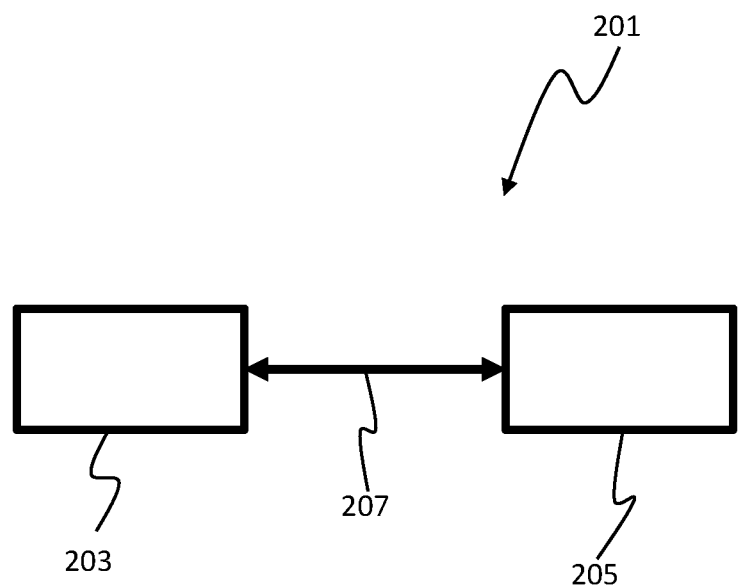
FIG. 2 depicts an automation system.

FIG. 2 shows an automation system 201.

The automation system 201 comprises a controller 203 and a server 205. The controller 203 and the server 205 may communicate with each other which is symbolically shown by a double arrow having reference numeral 207.

The controller 203 is configured to carry out the method for transmitting time-synchronized data. The controller 203 is e.g. configured to carry out the method of FIG. 1.

According to an embodiment, the controller 203 is disclosed as a stand-alone configuration, i.e. without the server 205.

The controller 203 has a local time, e.g. a time base, which is based on a real-time capable communications network. In e.g. the real-time capable field-bus network EtherCAT, such a local time may be a Distributed Clock Time.

The server 205 has a reference time that is e.g. Universal Time.

The controller 203 adjusts its local time to the reference time of the server 205 according to an embodiment of a method for transmitting time-synchronized data. This is explained in the following with reference to FIG. 3.

Figure 3:
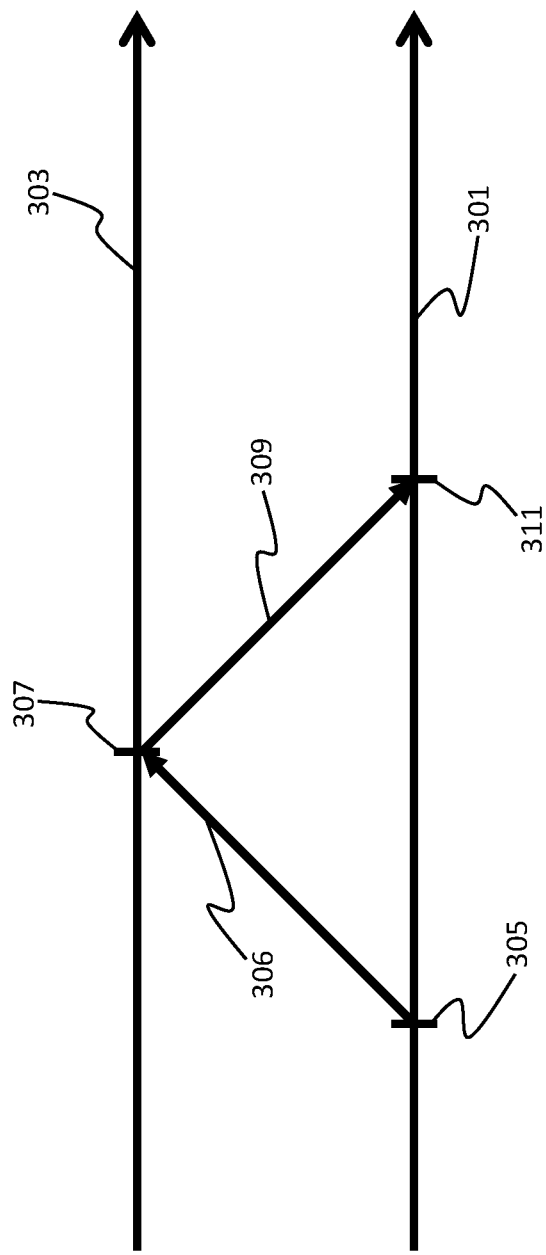
FIG. 3 shows two time-lines.

FIG. 3 shows a first time line 301 symbolizing the local time of the controller 203.

FIG. 3 furthermore shows a second time line 303 symbolizing the reference time of the server 205.

Figure 4:
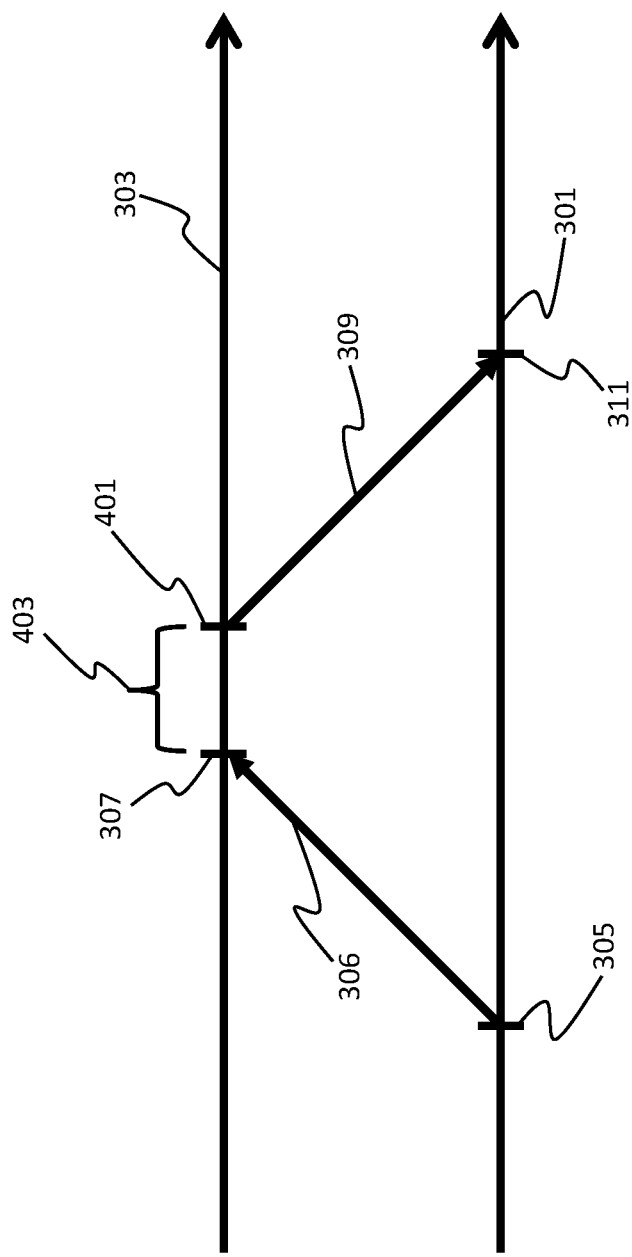
FIG. 4 shows two further time-lines.

In analogy to FIG. 3, FIG. 4 shows the first and the second time line 301, 303. The explanations given in the following and in context with FIG. 3 essentially apply analogously to FIG. 4. The differences between the two figures will be described in more detail in the following.

On the time line 301, a first point in time is characterized with reference numeral 305. At this point in time 305, the controller 203 sends a request for the reference time to the server 205. The first point in time 305 thus corresponds to a transmission time that indicates when the request for the local time was sent to the server 205 by means of the controller 203.

The sending of the request is symbolically shown by means of an arrow having reference numeral 306.

On the second time line 303, a second point in time is marked with reference numeral 307. This point in time 307 indicates when the request of the controller 203 was received by means of the server 205. Thus, the second point in time 307 corresponds to a first receiving time of the request, said first receiving time indicating when the request according to the reference time was received by means of the server 205.

The server 205 sends a reply to the controller 203, the reply indicating a first receiving time 307.

The process of sending the reply from server 205 to the controller 203 is symbolically shown by an arrow with reference numeral 309.

On the first time line 301, a third point in time is marked with reference numeral 311. This point in time 311 indicates when the reply from the server 205 was received by means of the controller 203. This point in time 311 thus corresponds to a second receiving time that indicates when the reply according to local time was received by means of the controller 203.

In a further embodiment according to FIG. 4, a further point in time on the second time line 303 is marked with reference numeral 401. The point in time 401 follows upon the second point in time 307 wherein the time span is characterized by a curly bracket having reference numeral 403. This time span 403 corresponds to the processing time of the server which it requires before sending the reply to the controller. The server does not send its reply to the controller until point in time 401, i.e. after expiry of the processing time.

According to FIG. 4, in its reply the server e.g. sends the processing time 403 and/or the receiving time 307 and/or the point in time 401. The controller may then more precisely calculate the Round Trip Time on the basis of the processing time 403, the receiving time 307 or, respectively, the point in time 401 and the second receiving time 311 e.g. according to the following equation: RTT=second receiving time 311 minus sending time 305 minus processing time 403.

Without any knowledge (FIG. 3) on the processing time 403, the RTT is e.g. calculated by means of the following equation: RTT=second receiving time 311 minus sending time 305.

In an embodiment it is provided that the controller 203 sends the transmission time 305 to the server 205 together with the request. According to this embodiment, it is provided according to a further embodiment that the reply of the server 205 comprises the sending time 305.

In the following, the sending time 305 is referred to as $t_0$.

The first receiving time 307 is in the following referred to as $t_R$.

In the following, the second receiving time 311 is referred to as $t_1$.

When knowing the processing time 403, the term "$t_1-t_0$" may in the following or above-mentioned equations be replaced by the term "$t_1-t_0-V$," wherein V refers to the processing time 403 of the server.

According to an embodiment, it is provided that the received reference time, i.e. the first receiving time $t_R$ is corrected as follows:

$$t_U = t_R + \frac{(t_1 - t_0)}{2}.$$

In this context, $t_U$ indicates the corrected reference time.

The time difference between the local time and the reference time thus results from the following equation:

$$\Delta t_{server} = t_U - t_1,$$

with $\Delta t_{server}$ referring to the time difference.

According to an embodiment, said time difference is upheld after an initial transient response and after reaching a stability, and no longer erratically changed in order to avoid skips after the time-caused transient response.

According to an embodiment, with regard to the running time a flowing adaption of the time difference is cyclically carried out by means of a corrective value $\Delta_A$.

For example, it is provided according to an embodiment that the steps 101, 103, 105 according to the flow chart of FIG. 1 be cyclically carried out several times one after the other by means of the controller 203 in order to at first determine a first corrected reference time $t_{U0}$ in a first cycle and to subsequently determine a second corrected reference time $t_{U1}$ in a later second cycle, wherein a corrective value $\Delta_A$ is determined by means of the controller, with $$\Delta_A = \frac{(t_{U1} - t_{U0})}{(t_{L1} - t_{L0})} \times T_C,$$

wherein $t_{L0}$ is the receiving time corresponding to the first cycle, wherein $t_{L1}$ is the second receiving time corresponding to the second cycle, wherein $T_C$ is the cycle time, wherein the time difference $\Delta t1_{server}$ corresponding to the second cycle is corrected by means of the corrective value $\Delta_A$ according to the following equation:

$$\Delta t1_{server} = \Delta t0_{server} + \Delta_A,$$

wherein $\Delta t0_{server}$ is the time difference corresponding to the first cycle.

The local reference time thus advantageously results from the local time and the time difference corrected by the corrective value.

In this respect, in one embodiment the time stamp is calculated according to the following equation:

$$t_{measurement\ data} = t_{local} + \Delta t_{server},$$

wherein $t_{measurement\ data}$ refers to the time stamp, $t_{local}$ refers to the local time and $\Delta t_{server}$ refers to the time difference.

Said time difference $\Delta t_{server}$ is thus, according to an embodiment, corrected by means of the corrective value $\Delta_A$.

The controller 203 thus adds the determined time stamp to the measurement data in order to obtain time-synchronized measurement data. The controller 203 then transmits the time-synchronized measurement data to the server 205.

It is e.g. intended to cyclically transmit the time-synchronized measurement data to the server 205.

It is e.g. provided that the time-synchronized measurement data are buffered in a data buffer of the controller 203 for several cycles before the time-synchronized measurement data are subsequently transmitted to the server 205.

In summary, the present invention may particularly be based on the adaption of properties such as the Network Time Protocol to the demands of automation as well as on the transmission of the corresponding properties to e.g. protocols such as Automation Device Specification, a transmission protocol developed and sold by the applicant, and/or MQTT ("Message Queue Telemetry Transport").

The inventive concept may in particular be very inexpensive.

In particular, the inventive concept allows for efficiently supporting individual network hardware as well as wireless network connections.

The inventive concept further allows for efficient support of inhomogeneous networks such as Internet/cloud applications.

Furthermore, the inventive concept advantageously allows for efficient support of any desired and thus e.g. proprietary protocols, infrastructures and/or media.

The inventive concept particularly and advantageously allows for optimized evaluation and optimized algorithms in real-time systems with cyclic processing.

The inventive concept may advantageously be implemented in an already existing infrastructure in an efficient manner, i.e. in particular in an already existing automation system.

The inventive concept advantageously does not require an exclusive utilization of network components.

The inventive concept advantageously allows for a high synchronization frequency.

The inventive concept may according to an embodiment advantageously be implemented or used in distributed measuring systems. For example, the inventive concept may be used via vibration measurements in wind-energy plants and in general for general measurements in wind-energy plants.

This e.g. means that the automation system according to an embodiment comprises a wind-energy plant. The controller is e.g. a controller of the wind-energy plant.

In an embodiment, a wind-energy plant comprises a plurality of controllers wherein an individual controller of the wind-energy plant is e.g. programmed for a predetermined task. For example, a first controller of the wind-energy plant only takes measurement data of sensors and processes the measurement data. A second controller of the wind-energy plant e.g. controls a position of the rotor blades of the wind-energy plant.

For example, a vibration sensor is provided for measuring a vibration of the wind-energy plant. The measurement data of the vibration sensor are then, as described above, synchronized with regard to time and transmitted to a server of the automation system.

The inventive method described herein is particularly efficient in connection with wind-energy plants. Usually, individual wind-energy plants are spatially distributed. This is e.g. the case in a so-called offshore wind park. The wind-energy plants are e.g. each controlled by an associated controller. The spatial distribution of the individual wind-energy plants is known to a server and/or the controllers of the wind-energy plants.

If e.g. a change of wind intensity is determined in one of the plurality of wind-energy plants, the one measured change of wind intensity may be made available to the other wind-energy plants using a highly precise time stamp. By using the highly precise time stamp and the measured wind intensity, it is possible to calculate at which points in time the changed wind intensity is to be expected in the other wind-energy plants.

Calculating the points in time may e.g. take place locally in a server and/or peripherally in the controllers. The other wind-energy plants may be adjusted with regard to the change of wind intensity so that the behavior of the other wind-energy plants is optimized with regard to this meteorological condition. For example, the position of the rotor blades of a wind-energy plant may be adjusted.

In particular in connection with photovoltaic systems, the inventive method described herein is efficient. Photovoltaic systems are usually spatially distributed. Photovoltaic systems are e.g. each controlled by means of an associated controller. The spatial distribution of the individual photovoltaic system is known to a server and/or to the inventive controllers of the photovoltaic systems. If e.g. a change in irradiation intensity is measured in one of the plurality of photovoltaic systems, the measured one change of irradiation intensity may be made available to the other photovoltaic systems by using a highly precise time stamp. A change in irradiation intensity may e.g. have clouding as a cause. By using the highly precise time stamp and the measured irradiation intensity, it is possible to calculate at which points in time the changed irradiation intensity is to be expected in the other photovoltaic systems.

The points in time may be calculated locally in a server and/or peripherally in the controllers. An adjustment of the other photovoltaic systems with regard to a change of irradiation intensity may then be carried out. Such an adjustment may e.g. be a change of the parameters of the technical components. An optimized behavior of the other photovoltaic systems may be achieved by an inventive method.

For example, the inventive concept may be used even if a plurality of controllers are provided that are in a spatially distributed arrangement. This e.g. advantageously allows for a time synchronization of the local times of the plurality of controllers of wind-energy plants in a wind-energy park.

The inventive concept may advantageously be implemented into an already existing wind-energy-plant infrastructure, which is intended according to an embodiment.

A further possibility of application is, according to an embodiment, an implementation in an electron-accelerator system. This e.g. means that the automation system comprises an electron accelerator.

In this context, it is provided according to an embodiment that the local times of the controllers of the electron accelerator synchronize according to the inventive concept so that time-synchronized measurement data may correspondingly be transmitted from the plurality of controllers to a local unit, i.e. the server.

The inventive concept may e.g. be efficiently used (and e.g. be intended as such) if a plurality of measurement data are processed or, respectively, analyzed by peripheral controllers, in particular if those are spatially distributed. Such structures are e.g. employed in so-called wind parks, i.e. an arrangement of a plurality of wind-energy plants, or arrangements of photovoltaic systems.

This invention has been described with respect to exemplary embodiments. It is understood that changes can be made and equivalents can be substituted to adapt these disclosures to different materials and situations, while remaining with the scope of the invention. The invention is thus not limited to the particular examples that are disclosed, but encompasses all the embodiments that fall within the scope of the claims.

What is claimed is:

1. A method for transmitting time-synchronized data from a controller of an automation system having a local time to at least one subscriber of the automation system, wherein the automation system comprises a server having a reference time, the method comprising the following steps:
sending a reference time request to the server by means of the controller,
receiving a response from the server by means of the controller, wherein the response comprises a first receiving time of the request which indicates when the request was received by means of the server according to the reference time,
determining, by means of the controller, a time difference between the reference time of the server and the local time of the controller based on a sending time that indicates when the request according to the local time was sent by means of the controller based on the first receiving time and based on a second receiving time which indicates when the response according to the local time was received by means of the controller,
adding a time stamp to the data by means of the controller wherein the time stamp is determined based on the local time and the time difference in order to receive time-synchronized data, wherein the data comprise measurement data and/or are based on measurement data,
transmitting the time-synchronized data by means of the controller to the at least one subscriber of the automation system.

2. The method of claim 1, wherein the transmission time is sent to the server together with the request by means of the controller.

3. The method of claim 2, wherein the response comprises the sending time.

4. The method of claim 1, wherein the steps a), b) and c) are repeated several times in a cyclic manner by means of the controller in order to determine a plurality of time differences, wherein a mean value of the plurality of time differences is determined which is used as a time difference for determining the time stamp by means of the controller.

5. The method of claim 1, wherein the steps a), b) and c) are repeated several times in a cyclic manner by means of the controller in order to determine a plurality of time differences wherein a filtering function is applied to the plurality of time differences by means of the controller in order to obtain a filtered time difference which is used as a time difference for determining the time stamp by means of the controller.

6. The method of claim 1, wherein the time stamp is determined according to the following equation:

$$t_{measurement\ data} = t_{local} + \Delta t_{server},$$

wherein $t_{measurement\ data}$ indicates the time stamp, $t_{local}$ indicates the local time and wherein $\Delta t_{server}$ indicates the time difference.

7. The method of claim 6, wherein $\Delta t_{server}=t_U-t_1$, wherein $t_U$ indicates a corrected reference time, wherein $t_1$ indicates the second receiving time, and wherein $$t_U = t_R + \frac{(t_1 - t_0)}{2},$$

wherein $t_R$ indicates the first receiving time and wherein $t_0$ indicates the transmission time.

8. The method of claim 7, wherein the steps a), b) and c) are repeated several times in a cyclic manner by means of the controller in order to determine a first corrected reference time $t_{U0}$ in a first cycle and in order to subsequently determine a second corrected reference time $t_{U1}$ in a later second cycle, wherein a correction value $\Delta_A$ is determined by means of a controller using $$\Delta_A = \frac{(t_{U1} - t_{U0})}{(t_{L1} - t_{L0})} \times T_C,$$

wherein $t_{L0}$ refers to the second receiving time corresponding to the first cycle, wherein $t_{L1}$ indicates the second receiving time corresponding to the second cycle, wherein $T_C$ indicates the cycle time, and wherein the time difference $\Delta t1_{server}$ corresponding to the second cycle is corrected with the correction value $\Delta_A$ according to the following equation:

$\Delta t1_{server}=\Delta t0_{server}+\Delta_A$, wherein $\Delta t0_{server}$ refers to the time difference corresponding to the first cycle.

9. The method of claim 8, wherein a correction value is determined for each of a plurality of cycles, wherein a mean value of the respective correction value is determined by means of the controller, said mean value being used as a correction value for correcting a time difference corresponding to a cycle following one of the plurality of cycles by means of the controller.

10. The method of claim 8, wherein a correction value is determined for each of a plurality of cycles, wherein a filtering function is applied to the plurality of correction values by means of the controller in order to obtain a filtered correction value which is used as a correction value for correcting the time difference by means of the controller.

11. The method of claim 1, further comprising receiving a command sent from the server by means of the controller, wherein the command simulates that the controller is to send a request for the reference time to the server so that the request for the reference time is sent to the server only in response to the receipt of the command by means of the controller.

12. The method of claim 1, wherein the at least one subscriber comprises the server including a reference time and/or a data-storage server for storing the time-synchronized data.

13. An automation system comprising a controller, wherein time-synchronized data from the controller of the automation system having a local time are transmitted to at least one subscriber of the automation system, wherein the automation system further comprises a server having a reference time, wherein the controller sends a reference time request to the server, wherein the controller receives a response from the server, wherein the response comprises a first receiving time of the request which indicates when the request was received by means of the server according to the reference time, wherein the controller determines a time difference between the reference time of the server and the local time of the controller based on a sending time that indicates when the request according to the local time was sent by means of the controller based on the first receiving time and based on a second receiving time which indicates when the response according to the local time was received by means of the controller, wherein the controller adds a time stamp to the data, wherein the time stamp is determined based on the local time and the time difference in order to receive time-synchronized data, wherein the data comprise measurement data and/or are based on measurement data, and wherein the controller transmits the time-synchronized data to the at least one subscriber of the automation system.

14. The automation system of claim 13, wherein the transmission time is sent to the server together with the request by means of the controller.

15. The automation system of claim 14, wherein the response comprises the sending time.

16. The automation system of claim 13, wherein the time stamp is determined according to the following equation:

$t_{measurement\ data}=t_{local}+\Delta t_{server}$, wherein $t_{measurement\ data}$ indicates the time stamp, $t_{local}$ indicates the local time and wherein $\Delta t_{server}$ indicates the time difference.

17. The automation system of claim 16, wherein $\Delta t_{server}=t_U-t_1$, wherein $t_U$ indicates a corrected reference time, wherein $t_1$ indicates the second receiving time, wherein $$t_U = t_R + \frac{(t_1 - t_0)}{2},$$

wherein $t_R$ indicates the first receiving time and wherein $t_0$ indicates the transmission time.

18. The automation system of claim 13, further comprising receiving a command sent from the server by means of the controller, wherein the command simulates that the controller is to send a request for the reference time to the server so that the request for the reference time is sent to the server only in response to the receipt of the command by means of the controller.

19. The automation system of claim 13, wherein the at least one subscriber comprises the server including a reference time and/or a data-storage server for storing the time-synchronized data.

20. An automation system comprising one or a plurality of spatially distributed facilities for generating regenerative energy that are each controlled by an associated controller, wherein time-synchronized data from the controller having a local time are transmitted to at least one subscriber of the automation system, wherein the automation system further comprises a server having a reference time, wherein the controller sends a reference time request to the server, wherein the controller receives a response from the server, wherein the response comprises a first receiving time of the request which indicates when the request was received by means of the server according to the reference time, wherein the controller determines a time difference between the reference time of the server and the local time of the controller based on a sending time that indicates when the request according to the local time was sent by means of the controller based on the first receiving time and based on a second receiving time which indicates when the response according to the local time was received by means of the controller, wherein the controller adds a time stamp to the data, wherein the time stamp is determined based on the local time and the time difference in order to receive time-synchronized data, wherein the data comprise measurement data and/or are based on measurement data, wherein the controller transmits the time-synchronized data to the at least one subscriber of the automation system; and wherein each of the facilities comprises one or a plurality of sensors, respectively, wherein a time stamp is added to each of the respective measurement data or, respectively, to respective processed measurement data of the sensors of each individual facility in order to obtain time-synchronized data, wherein the time-synchronized data are provided from a controller of one of the facilities to other controllers of other such facilities so that the other controllers each control their associated facility based on the time-synchronized data.

\* \* \* \* \*